(12) United States Patent
Guo

(10) Patent No.: US 9,575,109 B2
(45) Date of Patent: Feb. 21, 2017

(54) METHOD AND APPARATUS FOR REMOTE COAL MINE LEAKAGE TEST

(71) Applicant: Chunping Guo, Jiexiu, CA (US)

(72) Inventor: Chunping Guo, Jiexiu, CA (US)

( * ) Notice: Subject to any disclaimer, the term of this patent is extended or adjusted under 35 U.S.C. 154(b) by 62 days.

(21) Appl. No.: 14/655,564

(22) PCT Filed: Nov. 7, 2013

(86) PCT No.: PCT/CN2013/086682
§ 371 (c)(1),
(2) Date: Jun. 25, 2015

(87) PCT Pub. No.: WO2014/101574
PCT Pub. Date: Jul. 3, 2014

(65) Prior Publication Data
US 2015/0355258 A1 Dec. 10, 2015

(30) Foreign Application Priority Data
Dec. 26, 2012 (CN) .......................... 2012 1 0578705

(51) Int. Cl.
*G01R 31/02* (2006.01)
*E21F 17/04* (2006.01)
(52) U.S. Cl.
CPC ............ *G01R 31/025* (2013.01); *E21F 17/04* (2013.01)
(58) Field of Classification Search
CPC ................................ E21F 17/04; G01R 31/025
USPC .......................................................... 324/509
See application file for complete search history.

(56) References Cited

FOREIGN PATENT DOCUMENTS

| CN | 2610341 Y | 4/2004 |
| CN | 201035125 Y | 3/2008 |
| CN | 201975295 U | 9/2011 |
| CN | 202351403 U | 7/2012 |
| CN | 102983547 A | * 3/2013 |
| CN | 203025298 U | * 6/2013 |

OTHER PUBLICATIONS

International Search Report for PCT/CN2013/086682 mailed Feb. 13, 2014.

(Continued)

*Primary Examiner* — Thomas Valone
(74) *Attorney, Agent, or Firm* — Paul M. H. Pua; Foley & Lardner LLP

(57) ABSTRACT

Provided are a method and apparatus for remote coal mine leakage test. The remote leakage test method comprising: installing and connecting a leakage test device (3) at the a control switch (2) located at the most distal end of a coal mine power line (5); a leakage detection and protection device (1) connecting the leakage test device (3) via the coal mine power line (5) and providing it with a detection circuit for detecting whether remote leakage has occurred; generating a grounding current flowing through the coal mine power line (5) by controlling the grounding of the leakage test device (3); the leakage detection and protection device (1) detecting the grounding current, and enabling a leakage protection relay (KA) to operate, so as to cut off the coal mine power line (5); and detecting the coal mine power line (5) or manually observing an indication lamp (HL), so as to determine whether the remote leakage test is successful. The coal mine remote leakage test device and method are safe, convenient and time-saving.

11 Claims, 2 Drawing Sheets

(56) References Cited

OTHER PUBLICATIONS

Written Opinion for PCT/CN2013/086682 maileed Feb. 13, 2014.
Chen, Qunbin et al., Study and application of remote leakage test device for low voltage power supply system used in coal mine, Coal mine modernization, Feb. 2011 (Feb. 2011), No. 1, pp. 73 and 74, ISSN: 1009-0797.
Li, Li, Remote leakage test comparing with on-the-spot leakage test underground in coalmines, Science and technology of datong coal mining administration, Dec. 2006 (Dec. 2006, No. 4, pp. 43 and 44, ISSN: 1000-4866.

* cited by examiner

METHOD AND APPARATUS FOR REMOTE COAL MINE LEAKAGE TEST

RELATED APPLICATIONS

This application is the U.S. National Stage of International Application Number PCT/CN2013/086682, filed Nov. 7, 2013, which claims the benefit of and priority to Chinese Patent Application Number 201210578705.2, filed Dec. 26, 2012. The entire contents of the foregoing applications are hereby incorporated herein by reference for all purposes.

TECHNICAL FIELD

The present disclosure relates to the field of coal mine safety, particularly, and more particularly to a method and apparatus for remote coal mine leakage test performed locally or over a network.

DESCRIPTION OF THE RELATED ART

According to Article 457 of THE LAW OF THE PEOPLE'S REPUBLIC OF CHINA ON SAFETY IN MINES, underground low voltage feeders must be provided with leakage detection and protection devices or, optionally, leakage protection devices to guarantee the automatic cutoff a feeder having a leak occurred thereon. A trip test must be carried out every day to demonstrate the appropriate operation of the leakage test device.

According to Rule 19 of the LOW VOLTAGE LEAK DETECTION REGULATION, with the assistance of a gas inspector, a remote artificial trip test must be carried out on a newly installed leakage detection and protection device before it is placed in service for the first time. For an operating leakage protection device, a remote artificial leak trip test must be performed at least once a month. In a remote artificial trip test of an optional leakage protection device, upon the open of the branch switch of a primary leakage protection device, an artificial leak trip test should be carried out at the inlet of the branch switch, for remaining branch switches, a remote artificial trip test must be carried out respectively. The particular test method is as follows: connect test resistors on the load side of a most distal control switch according to different voltage levels (a 2 kΩ 10 W resistor for 127 V, a 3.5 kΩ 10 W resistor for 380 V, a 11 kΩ 10 W resistor for 660 V, a 20 kΩ 10 W resistor for 1140 V). For example, in a most distal electromagnetic starter, a test resistor has its one end connected to a screw of a fusible element, and another end connected to the shell. Power is supplied after an outer cap is closed to check whether a feed switch is tripped. If so, it indicates that the action of the leakage detection and protection device is reliable. After the test, the test resistor has to be removed.

Also, according to Rule 19 of the LOW VOLTAGE LEAK DETECTION REGULATION referred to herein, there is not a special remote leakage test device used for the existing remote leakage test method, and a test resistor must be connected in an electromagnetic starter in advance, which has the following defects:

Unsafety: it is required to open a switch explosion-proof cap, electrical inspection, discharging, connecting a resistor on a 660 V or 1140 V line, all of which may have unsafe factors.

Irregularity: there is not a special grounding terminal provided within the most distal control switch. Connecting a test resistor within the switch is analogous to adding an element, which does not comply with the requirements of explosion protection standards.

Inconvenience: an on-site electrician and a gas inspector are required. The assistance of the gas inspector is necessary for checking gas concentration, power down, opening the cover, electrical inspection, discharging.

Time consuming: a gas inspector must be contacted for power down. Checking gas concentration, power down, opening the cover, electrical inspection, discharging, connecting a resistor, closing the cover, power on, enabling the switch will take some time.

Difficulty in inspection: in most case, the most distal control switch is a magnetic starter, which generally does not have a display provided thereon, so that it is difficult to accurately distinguish whether the remote leakage test works well (if power down occurs).

SUMMARY

The object of the present disclosure is to overcome the issues existed in the prior art and to provide a method and apparatus dedicated for remote coal mine leakage test, which is suitable for remote leakage test performed locally or over a network.

In view of the object of the present disclosure described above, the following technical solutions are provided:

a method for remote coal mine leakage test, comprising the following steps: installing and connecting a leakage test device at a control switch located at the most distal end of a coal mine power line; connecting a leakage detection and protection device through the coal mine power line to the leakage test device located at the most distal control switch and providing it with a detection circuit for detecting whether a remote leakage occurs, the detection circuit being composed of, such as a DC power, a relay, a reactor, a zero sequence current detector or a carrier detector; controlling the leakage test device to be grounded to produce grounding current passing through the coal mine power line; detecting the grounding current by the leakage detection and protection device to activate the action of a leakage protection relay so as to cut off the coal mine power line; detecting the coal mine power line or observing an indication lamp by a remote leakage test operator to determine whether the remote leakage test is successful.

Preferably, the step of detecting the coal mine power line comprises: detecting with a feed sensor voltage or current on the coal mine power line to obtain a voltage or current detection signal, and feeding back the voltage or current detection signal to a monitoring system or a substation through fx1; determining whether the remote leakage test is successful by the monitoring system or substation according to the voltage or current detection signal, or by a remote leakage test operator observing an indication lamp.

Preferably, the step of detecting the coal mine power line further comprises: detecting voltage or current on the coal mine power line using a leakage test device to obtain a voltage or current detection signal, and feeding back the voltage or current detection signal to a monitoring system or a substation through fx; determining whether the remote leakage test is successful by the monitoring system or substation according to the voltage or current detection signal.

Preferably, the step of controlling the leakage test device to be grounded comprises: performing a remote leakage test by the leakage test device according to a grounding instruction from the monitoring system or substation.

Preferably, the step of controlling the leakage test device to be grounded further comprises: performing a remote leakage test by the leakage test device according to an on-site manual operation.

Preferably, the leakage test device comprises: a grounding test resistor having its one end connected to any two of three phases on the power supply side of the control switch, and a switch execution component connected between the other end of the grounding test resistor and the ground.

Preferably, the leakage test device further comprises: a control component connected to the monitoring system or the substation for controlling ON/OFF of the switch execution component; a switch protection component connecting the control component to the coal mine power line; a second control button connected between the other end of the grounding test resistor and the ground.

Preferably, the control component comprises: a transformer having its primary side connected to any two of three phases on the power supply side of the control switch and its secondary side connected to an indication lamp for determining whether a remote leakage test is successful; rectifier having its input connected to the secondary side of the transformer; a processing device connected to the monitoring system or the substation, having its power supply input connected to the input of the rectifier or a power input of the substation, to control ON/OFF of the switch execution component according to an instruction of the monitoring system and feeding back a message indicating power interruption on the coal mine power line to the monitoring system or the substation; an on-site manual controller connected to the secondary side of the rectifier, which is composed of a first control button and a relay coil connected in series.

Preferably, the switch protection component comprises: a fuse and a disconnector for connecting the primary side of the transformer to any two of three phases on the power supply side of the control switch.

Preferably, the switch execution component comprises: a switch contact controlled by the processing device; a switch contact controlled by the on-site manual controller.

Preferably, the coal mine power supply signal, the control signal and the feedback signal of the present disclosure may be transmitted on a plurality of cables or by carriers.

A remote leakage test device, comprising: a coal mine power line for supplying power; a leakage test device installed and connected at a most distal control switch on the coal mine power line, which is accommodated in an explosion-proof housing M or a normal housing; a leak detection and protection device connected to the leakage test device through the coal mine power line; a check device for checking the result of a remote coal mine leakage test, wherein through controlling the leakage test device to be grounded, grounding current is produced on the coal mine power line or grounding impedance is reduced, such that the leakage detection and protection device cuts off power supply on the coal mine power line according to the grounding current or zero sequence current or grounding impedance, as a result, the check device or a remote leakage test operator determines whether the remote leakage test is successful according to an interruption message of the coal mine power line or by observing an indication lamp.

Preferably, the leakage test device is accommodated in a specially designed explosion-insulation housing M or other explosion-proof housing or a normal housing M, the contacts of the first control button and the second control button are provided in the interior of the housing M, with their operation handles penetrating through the wall of the housing M and exposed outside of the housing M.

Preferably, the monitoring system or substation may be provided separately or in a feed switch.

The present disclosure has the following advantageous effects.

1. Safety: the remote leakage test device of the present disclosure is directly provided in the interior of an explosion-proof housing to avoid the need of opening an explosion-proof cap, electrical inspection, discharging, or connecting a resistor on a 660 V or 1140 V line.

2. Convenience: in a remote leakage test, no assistance of a gas inspector is required, and it is not necessary to contact for power down in advance; no gas concentration inspection, power down, cover opening, electrical inspection, discharging is required.

3. Time saving: in a remote leakage test, it is not required to contact a gas inspector, and it is not necessary to contact for power down in advance; no gas concentration inspection, power down, cover opening, electrical inspection, discharging, cover closing, power on, switch starting is required.

4. Inspection convenience: when the remote leakage test is performed, an overground or underground monitoring system may display and automatically memorize the situation of test actions (such as, power down); a display is provided for the remote switch to facilitate the observation of an electrician.

This disclosure relates to a method and device for coal mine leakage test with higher popularization value.

DETAILED DESCRIPTION OF THE PREFERRED EMBODIMENT

Figure 1:
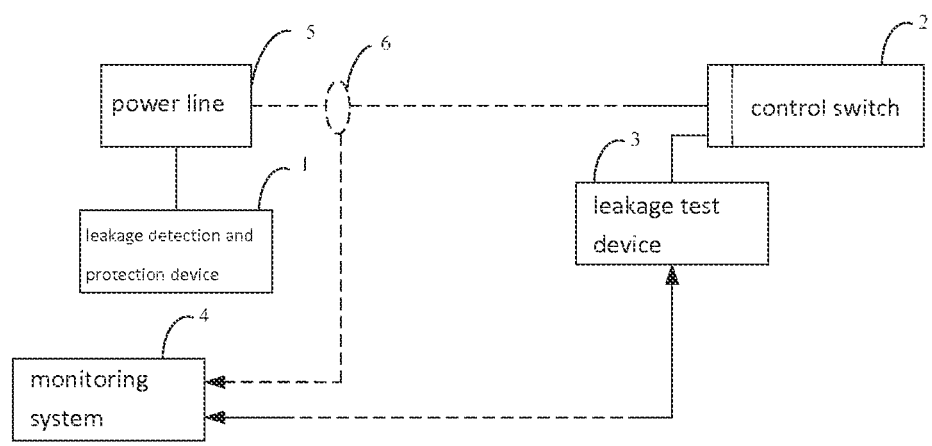
FIG. 1 is a block diagram of a method and device for remote leakage test.

As shown in FIG. 1, a method for remote coal mine leakage test is provided in this disclosure, comprising the following steps:

Installing and connecting a leakage test device 3 at a control switch 2 located at the most distal end of a coal mine power line 5.

Connecting a leakage detection and protection device 1 through the coal mine power line 5 to the leakage test device 3 located at the most distal control switch 2 and providing it with a detection circuit for detecting whether a remote leak occurs.

Controlling the leakage test device 3 to be grounded to produce grounding current passing through the coal mine power line 5, the leakage test device 3, and the leakage detection and protection device 1.

Detecting the grounding current by the leakage detection and protection device 1 to activate a leakage protection relay KA, wherein KA1 turns on a feed switch contactor KM, KM is activated and KM1 is tripped, so that the coal mine power line 5 is cut off.

Detecting the coal mine power line 5 or observing an indication lamp by a remote leakage test operator to determine whether the remote leakage test is successful.

As shown in FIG. 1, the step of detecting the coal mine power line comprises:

Detecting with a feed sensor 6 voltage or current on the coal mine power line 5 to obtain a voltage or current detection signal, and feeding back the voltage or current detection signal to a monitoring system 4 or a substation JK through fx1.

Determining whether the remote leakage test is successful by the monitoring system 4 or substation JK according to the voltage or current detection signal, or by a remote leakage test operator observing an indication lamp HL. Particularly, the feed sensor 6 comprises at least a current transformer or a voltage transformer installed on the coal mine power line 5, which is used to detect the current or voltage on the coal mine power line 5. In the case that the leakage detection and protection device 1 cut off the coal mine power line 5, the value of the current or voltage detected by the feed sensor 6 is zero. According to such a detection result, the monitoring system 4 or a substation JK may determine that the leakage test is successful.

The step of detecting the coal mine power line further comprises:

Detecting voltage or current on the coal mine power line using a leakage test device 3 to obtain a voltage or current detection signal, and feeding back the voltage or current detection signal to a monitoring system 4 or a substation JK through fx.

Determining whether the remote leakage test is successful by the monitoring system 4 or substation JK according to the voltage or current detection signal, or by a remote leakage test operator observing an indication lamp HL. Particularly, if the coal mine power line 5 is cut off, the leakage test device 3 connected to the coal mine power line 5 will obtain a power interruption message indicating that the value of its input voltage or current is zero. According to such a power interruption message, the monitoring system 4 or a substation JK may determine that the leakage test is successful.

The step of controlling the leakage test device 3 to be grounded comprises: performing a remote leakage test by the leakage test device 3 according to a grounding instruction from the monitoring system 4 or substation JK.

The step of controlling the leakage test device 3 to be grounded further comprises: performing a remote leakage test by the leakage test device 3 according to an on-site manual operation.

As shown in FIG. 1, this disclosure implements an apparatus for remote coal mine leakage test device performed locally or over a network, comprising: a coal mine power line 5 for supplying power; a leakage test device 3 installed at and connected to a control switch 2 located at the most distal end of the coal mine power line 5; a leakage detection and protection device 1 connected to the leakage test device 3 through the coal mine power line 5; a check device for checking the result of a remote coal mine leakage test. Wherein, through controlling the leakage test device 3 to be grounded, grounding current is produced in a loop formed by the coal mine power line 5, the leakage test device 3 and the leakage detection and protection device 1; when the grounding current is detected by the leakage detection and protection device 1, the power supply of the coal mine power line 5 is cut off, such that the check device, or a remote leakage test operator through observing an indication lamp, determines whether the remote leakage test is successful, according to the leakage detection and protection device 1 cutting off the power supply of the leakage test device 3. The check device for checking the result of a remote leakage test may be the monitoring system 4 or substation JK connected to the leakage test device 3.

An apparatus for remote leakage test further comprises a feed sensor 6 installed on the coal mine power line 5 and connected to the monitoring system 4 or substation JK, which is used to detect current on the coal mine power line 5 and transmit a detection result to the monitoring system 4 or substation JK.

An apparatus for remote leakage test further comprises an indication lamp HL installed on the secondary side of a transformer B, which is used to indicating a remote leakage test operator observing the indication lamp HL whether the remote leakage test is successful.

Figure 2:
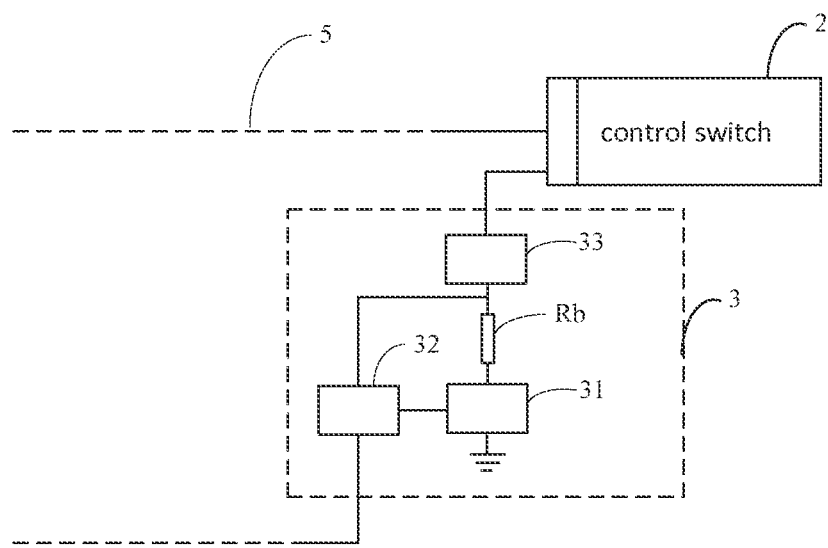
FIG. 2 is a schematic structural diagram of the leakage test device of FIG. 1.

As shown in FIG. 2, the leakage test device 3 comprises: a grounding resistor Rb having its one end connected to any one of three phases on the power supply side of the control switch 2, a switch execution component 31 connected between the other end of the grounding resistor Rb and the ground; a control component 32 connected to the monitoring system 4 or the substation JK for controlling ON/OFF of the switch execution component 31; a switch protection component 33 connecting the control component 32 and the grounding resistor Rb to the coal mine power line 5; a second control button SA2 connected between the other end of the grounding test resistor Rb and the ground, for performing a grounding test according to a manual operation.

Figure 3:
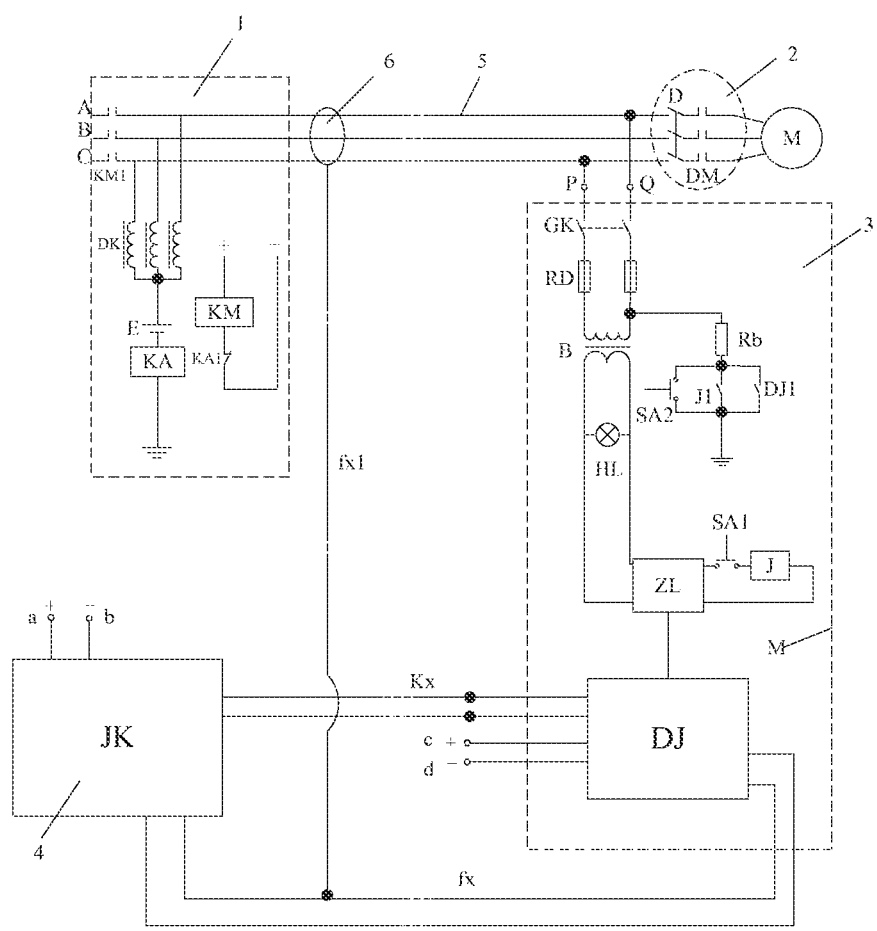
FIG. 3 is an electrical diagram of the remote leakage test of this disclosure.

As shown in FIG. 3, the control component 32 comprises: a transformer B having its primary side connected to any two of three phases on the power supply side of the control switch 2; a rectifier having its input connected to the secondary side of the transformer B; a processing device DJ connected to the monitoring system 4 or the substation JK, having its power supply input connected to the input of the rectifier ZL or a power input of the substation JK, for controlling ON/OFF of the switch execution component 31 according to an instruction of the monitoring system 4 or the substation JK and feeding back a message indicating power interruption on the coal mine power line 5 to the monitoring system 4 or the substation JK; an on-site manual controller connected to the secondary side of the rectifier ZL, which is composed of a first control button SA1 and a relay coil J connected in series.

Preferably, the switch protection component 33 comprises: a fuse RD and a disconnector GK for connecting the primary side of the transformer B to the coal mine power line 5 through the fuse RD and a disconnector GK.

The processing device DJ is a breaker, comprising: a controlled terminal connected to a control terminal of the monitoring system 4 or the substation JK through a control line kx; a feedback terminal connected to the monitoring terminal of the monitoring system 4 or the substation JK through a feedback line fx; and an external power supply terminal, which is an power input terminal connected to the input of the rectifier ZL or a power input of the substation JK.

The switch execution component 31 comprises: a switch contact DJ1 controlled by the processing device DJ; a switch contact J1 controlled by the on-site manual controller.

As shown in FIG. 3, the remote leakage test 3 is accommodated in a specially designed explosion-insulation housing M, the contacts of the first control button SA1 and the second control button SA2 are provided in the interior of the housing M, with their operation handles penetrating through the wall of the housing M and exposed outside of the housing M. The monitoring system 4 or substation JK may be provided separately or in a feed switch. The processing device DJ may be a remote control switch or a breaker correlative to the mining/power monitoring system 4 or substation JK. According to the LOW VOLTAGE LEAK DETECTION REGULATION, the grounding test resistor Rb is selected depending on voltage levels. Other elements are common elements, which can be designed according to relative specifications.

Below, a detailed description of the method for remote leakage test will be given with reference to FIG. 3.

A first networking test method: in the monitoring system 4 located at a dispatching room or in its substation JK, a button for remote leakage test is pressed. A remote leakage test instruction is transmitted to the processing device DJ through a control line kx. After receiving this instruction, DJ controls the switch contact DJ1 to close and connect the grounding test resistor Rb to the ground. At this point, grounding current is produced in a loop formed by the coal mine power line 5, the leakage test 3 and the leakage detection and protection device 1. The leakage detection and protection device 1 detects the grounding current, the leakage protection relay KA is activated, KA1 closes the feedback switch contactor KM, KM is activated, KM1 is tripped to cut off the power supply of the coal mine power line 5. The power supply at the most distal control switch is turned off, in the case of power interruption, the leakage test device 3 connected to the coal mine power line 5 obtains a power interruption message indicating that value of its input voltage or current is zero. The processing device DJ feeds back a power down information to the monitoring system 4 or the substation JK. After receiving a feedback signal, the monitoring system 4 or the substation JK delays and then transmits an open signal to DJ. After receiving the signal, DJ opens DJ1. The networking remote leakage test is successful and thus the networking test is completed. After the test, it is automatically registered on a computer in the dispatching room and is recorded by a dispatcher on a document.

A second networking test method: in the monitoring system 4 located at a dispatching room or in its substation JK, a button for remote leakage test is pressed. A remote leakage test instruction is transmitted to the processing device DJ through a control line kx. After receiving this instruction, DJ controls the switch contact DJ1 to close and connect the grounding test resistor Rb to the ground. At this point, grounding current is produced in a loop formed by the coal mine power line 5, the leakage test 3 and the leakage detection and protection device 1. The leakage detection and protection device 1 detects the grounding current, the leakage protection relay KA is activated, KA1 closes the feedback switch contactor KM, KM is activated, KM1 is tripped to cut off the power supply of the coal mine power line 5. The power supply at the most distal control switch 2 is turned off, in the case of power interruption, the feed sensor 6 will obtain information indicating that the voltage or current detection signal on the coal mine power line 5 is zero, and feed back the detection signal to the monitoring system 4 or the substation JK through fx1. After receiving a feedback signal, the monitoring system 4 or the substation JK delays and then transmits an open signal to DJ. After receiving the signal, DJ opens DJ1. The networking remote leakage test is successful and thus the networking test is completed. After the test, it is automatically registered on a computer in the dispatching room and is recorded by a dispatcher on a document.

In practice, any one of the above networking test methods may be selected as required.

A first on-site test method: a professional electrician comes to the control switch 2 located at the most distal end of a coal mine underground power grid and presses the first control button SA1 of the leakage test device 3, as a result, a relay coil connected thereto is activated to close the switch contact J1 and connect the grounding test resistor Rb to the ground. At this point, grounding current is produced in a loop formed by the coal mine power line 5, the leakage test 3 and the leakage detection and protection device 1. The leakage detection and protection device 1 detects the grounding current, the leakage protection relay KA is activated, KA1 closes the feedback switch contactor KM, KM is activated, KM1 is tripped to cut off the power supply of the coal mine power line 5. The power supply at the most distal control switch is turned off, and the indication lamp HL is turned off. The remote leakage test that is implemented on site is successful and thus the on-site remote test is completed. The professional electrician reports to the dispatching room and a dispatcher records it on a document.

A second on-site test method: a professional electrician comes to the control switch 2 located at the most distal end of a coal mine underground power grid and presses the second control button SA2 of the leakage test device 3, as a result, the grounding test resistor is connected to the ground. At this point, grounding current is produced in a loop formed by the coal mine power line 5, the leakage test 3 and the leakage detection and protection device 1. The leakage detection and protection device 1 detects the grounding current, the leakage protection relay KA is activated, KA1 closes the feedback switch contactor KM, KM is activated, KM1 is tripped to cut off the power supply of the coal mine power line 5. The power supply at the most distal control switch 2 is turned off, and the indication lamp HL is turned off. The remote leakage test that is implemented on site is successful and thus the on-site remote test is completed. The professional electrician reports to the dispatching room and a dispatcher records it on a document.

In practice, any one of the above on-site test methods may be selected as required.

The coal mine power supply signal, the control signal and the feedback signal of the present disclosure may be transmitted on a plurality of cables or by carriers.

The detection circuit for detecting whether a remote leak occurs used in the present disclosure may be a common zero sequence current detection device or a carrier detection device.

In the present disclosure, whether the remote leakage test is successful may be determined by a remote leakage test operator through observing the indication lamp HL.

Embodiment 1

The voltage on the load side of the most distal control switch 2 is 660 V, the selected grounding test resistor Rb is 11 KΩ, 10 W.

On-site test: a first control button SA1, rather than a second control button SA2, is installed for the test.

Networking test: the power supply a, b of the processing device DJ is connected in parallel with the power supply c, d of the substation JK, respectively. That is, a dedicated power supply is shared by the remote leakage test device 3 and substation JK of certain type of monitoring system 4. A feedback signal of the processing device DJ is outputted from the rectifier ZL. The remote leakage test is performed by networking a stereotyped mining/power monitoring system 4 or a substation JK with the processing device DJ.

Embodiment 2

The voltage on the load side of the most distal control switch 2 is 1140 V, the selected grounding test resistor Rb is 20 KΩ, 10 W.

On-site test: a first control button SA1, rather than a second control button SA2, is installed for the test.

Networking test: the power supply c, d of the processing device DJ is connected to the input of the rectifier ZL. A separate power supply is provided as the power supply a, b of the substation JK of the monitoring system 4. The feedback signal of the processing device DJ is outputted from the rectifier ZL. The remote leakage test is performed by networking a stereotyped mining/power monitoring system 4 or a substation JK with the processing device DJ. In the event of not providing the processing device DJ, the networking test cannot be implemented and only an on-site test may be implemented.

Embodiment 3

The voltage on the load side of the most distal control switch 2 is 127 V, the selected grounding test resistor Rb is 2 KΩ, 10 W.

On-site test: any two of three phases A, B and C are connected to the transformer B or indication lamp HL via a disconnecting switch GK or a fuse RD, and connected to a grounding test resistor Rb. The grounding test resistor Rb is grounded via a second control switch SA2. The switch contact DJ1 of the processing device DJ or the switch contact J1 controlled by the on-site remote controller is not connected in parallel. The second control switch SA2 is pressed manually to perform an on-site remote leakage test. The indication lamp HL is turned off if the test is successful.

Reference can be made to the previous description for the detailed steps of remote leakage test of the above three embodiments, which will not be described repeatedly herein.

Although the present disclosure has been described in detail, this disclosure is not limited thereto. Those skilled in the art may make modifications based on the principle of this disclosure. Therefore, all modifications made according to the principle of the present disclosure will be encompassed in the protection scope of the present disclosure.

The invention claimed is:

1. A method for remote coal mine leakage test, wherein:
   a leakage test device (3) is disposed at a control switch (2) located at the most distal end of a coal mine power line (5);
   said leakage test device (3) located at said control switch (2) is connected with a leakage detection and protection device (1) through said coal mine power line (5), and is provided with a detection circuit by said leakage detection and protection device (1) for detecting whether a remote leakage occurs;
   said leakage test device (3) is controlled to be grounded to produce a grounding current passing through said coal mine power line (5);
   on the condition that said grounding current is detected by said leakage detection and protection device (1), a leakage protection relay (KA) is activated to cut off said coal mine power line (5);
   detecting the coal mine power line or observing an indication lamp by a remote leakage test operator to determine whether the remote leakage test is successful.

2. The method according to claim 1, wherein that the step of detecting the coal mine power line comprising:
   detecting with a feed sensor (6) voltage or current on said coal mine power line (5) to obtain a voltage or current detection signal, and feeding back the voltage or current detection signal to a monitoring system (4) or a substation (JK) through fx1;
   determining whether the remote leakage test is successful by said monitoring system (4) or substation (JK) according to the voltage or current detection signal, or by a remote leakage test operator observing said indication lamp (HL).

3. The method according to claim 2, wherein that the step of detecting the coal mine power line comprising:
   detecting voltage or current on said coal mine power line (5) using said leakage test device (3) to obtain a voltage or current detection signal, and feeding back the voltage or current detection signal to said monitoring system (4) or substation (JK) through fx;
   determining whether the remote leakage test is successful by said monitoring system (4) or substation (JK) according to the voltage or current detection signal, or by a remote leakage test operator observing said indication lamp (HL).

4. The method according to claim 2, wherein that the step of said leakage test device (3) is controlled to be grounded comprising:
   performing the remote leakage test by said leakage test device (3) according to a test instruction from said monitoring system (4) or substation (JK).

5. The method according to claim 4, wherein that the step of said leakage test device (3) is controlled to be grounded further comprising:
   performing the remote leakage test by said leakage test device (3) according to a manual operation.

6. The method according to claim 5, wherein said leakage test device (3) comprising:
   a grounding resistor (Rb) having its one end connected to any one of three phases on the power supply side of said control switch (2);
   a switch execution component (31) connected between the other end of said grounding resistor (Rb) and the ground.

7. The method according to claim 6, wherein said leakage test device (3) further comprising:
   a control component (32) connected to said monitoring system (4) or said substation (JK), for controlling ON/OFF of said switch execution component (31);
   a switch protection component (33) connecting said control component (32) to said coal mine power line (5);
   a second control button (SA2) connected between the other end of said grounding test resistor (Rb) and the ground.

8. The method according to claim 7, wherein said control component (32) comprising:
   a transformer (B) having its primary side connected to any two of three phases on the power supply side of said control switch (2) and its secondary side connected to an indication lamp (HL) for determining whether a remote leakage test is successful;
   a rectifier (ZL) having its input connected to the secondary side of said transformer (B);
   a processing device (DJ) connected to said monitoring system (4) or said substation (JK), having its power supply input connected to the input of said rectifier (ZL) or a power input of said substation (JK), to control ON/OFF of said switch execution component (31) according to an instruction from said monitoring system (4) and feeding back a message indicating power interruption on said coal mine power line (5) to said monitoring system (4) or said substation (JK);

an on-site manual controller connected to the secondary side of the rectifier (ZL), which is composed of a first control button (SA1) and a relay coil (J) connected in series.

9. The method according to claim 8, wherein said switch execution component (31) comprising:
   a switch contact (DJ1) controlled by the processing device (DJ);
   a switch contact (J1) controlled by the on-site manual controller.

10. A device for remote leakage test, wherein comprising:
   a coal mine power line (5) for supplying power;
   a leakage test device (3) installed and connected at a control switch (2) located at the most distal end of the coal mine power line (5), which is accommodated in an explosion-proof housing M or a normal housing;
   a leakage detection and protection device (1) connected to said leakage test device (3) through said coal mine power line (5);

a check device for checking the result of a remote coal mine leakage test,
wherein through controlling said leakage test device (3) to be grounded, grounding current is produced on said coal mine power line (5), such that said leakage detection and protection device (1) cut off power supply on said coal mine power line (5) according to the grounding current, as a result, said check device or a remote leakage test operator determines whether the remote leakage test is successful according to an interruption message of said coal mine power line (5) or by observing an indication lamp (HL).

11. The method according to claim 3, wherein that the step of said leakage test device (3) is controlled to be grounded comprising:
   performing the remote leakage test by said leakage test device (3) according to a test instruction from said monitoring system (4) or substation (JK).

* * * * *

UNITED STATES PATENT AND TRADEMARK OFFICE
CERTIFICATE OF CORRECTION

| | |
|---|---|
| PATENT NO. | : 9,575,109 B2 |
| APPLICATION NO. | : 14/655564 |
| DATED | : February 21, 2017 |
| INVENTOR(S) | : Chunping Guo |

Page 1 of 1

It is certified that error appears in the above-identified patent and that said Letters Patent is hereby corrected as shown below:

On the Title Page

Item (71) Applicant should read:
Chunping Guo, Jiexiu City, Shanxi (CN)

Item (72) Inventor should read:
Chunping Guo, Jiexiu City, Shanxi (CN)

Signed and Sealed this
Thirteenth Day of June, 2017

Joseph Matal
*Performing the Functions and Duties of the*
*Under Secretary of Commerce for Intellectual Property and*
*Director of the United States Patent and Trademark Office*